United States Patent
Cerisier et al.

(10) Patent No.: US 7,130,594 B2
(45) Date of Patent: *Oct. 31, 2006

(54) POWER AMPLIFICATION DEVICE, ESPECIALLY WITH REDUCED INPUT DYNAMIC SWING, IN PARTICULAR FOR A CELLULAR MOBILE TELEPHONE

(75) Inventors: Patrick Cerisier, Copponex (FR); Andréa Panigada, Pavia (IT)

(73) Assignees: STMicroelectronics N.V., Amsterdam (NL); STMicroelectronics S.r.l., Agrate Brianza (IT)

( * ) Notice: Subject to any disclaimer, the term of this patent is extended or adjusted under 35 U.S.C. 154(b) by 387 days.

This patent is subject to a terminal disclaimer.

(21) Appl. No.: 10/754,464

(22) Filed: Jan. 9, 2004

(65) Prior Publication Data

US 2004/0162045 A1    Aug. 19, 2004

(30) Foreign Application Priority Data

Jan. 10, 2003    (EP)    ................................... 03290066

(51) Int. Cl.
 *H04B 1/04*    (2006.01)
 *H01Q 11/12*    (2006.01)
(52) U.S. Cl. ................................ 455/114.2; 455/127.3; 375/297

(58) Field of Classification Search ................. 455/91, 455/95, 126, 127.1, 127.2, 127.3, 114.2, 114.3; 375/295, 297; 330/291, 295

See application file for complete search history.

(56) References Cited

U.S. PATENT DOCUMENTS

| 5,039,989 | A | | 8/1991 | Welland et al. ............. 341/143 |
|---|---|---|---|---|
| 5,079,550 | A | * | 1/1992 | Sooch et al. ................ 341/143 |
| 5,982,315 | A | * | 11/1999 | Bazarjani et al. ........... 341/143 |
| 2004/0171397 | A1 | * | 9/2004 | Cerisier et al. ............. 455/501 |
| 2005/0162222 | A1 | * | 7/2005 | Hezar et al. ................. 330/10 |

FOREIGN PATENT DOCUMENTS

WO    01/03312    1/2001

* cited by examiner

*Primary Examiner*—Nguyen T. Vo
(74) *Attorney, Agent, or Firm*—Lisa K. Jorgenson; Allen, Dyer, Doppelt, Milbrath & Gilchrist, P.A.

(57) ABSTRACT

A power amplification device includes an input for receiving a signal having a desired frequency band. The signal also has a transfer function associated therewith. The power amplification device further includes power amplification circuitry having an order greater than or equal to one, and signal amplifiers connected between the input and the power amplification circuitry. Each signal amplifier has a predetermined gain so that zeros of the transfer function are outside the desired frequency band.

17 Claims, 2 Drawing Sheets

POWER AMPLIFICATION DEVICE, ESPECIALLY WITH REDUCED INPUT DYNAMIC SWING, IN PARTICULAR FOR A CELLULAR MOBILE TELEPHONE

FIELD OF THE INVENTION

The present invention relates to power amplification devices, and in particular but not exclusively, to power amplification devices for wireless communication systems, especially cellular mobile telephones.

BACKGROUND OF THE INVENTION

In a wireless communication system, a base station communicates with a plurality of remote terminals, such as cellular mobile telephones. Frequency Division Multiple Access (FDMA) and Time Division Multiple Access (TDMA) are the traditional multiple access schemes for delivering simultaneous services to a number of terminals. The basic idea underlying the FDMA and TDMA systems is based upon sharing the available resource, respectively as several frequencies or as several time intervals, in such a way that several terminals can operate simultaneously without causing interference.

In contrast to these schemes using frequency division or time division, Code Division Multiple Access (CDMA) allows multiple users to share a common frequency and a common time channel by using coded modulation. More precisely, as is well known to the person skilled in the art, a scrambling code is associated with each base station, and this makes it possible to distinguish one base station from another. Furthermore, an orthogonal code, known by the person skilled in the art as an OVSF Code, is allotted to each remote terminal (such as, for example, a cellular mobile telephone). All the OVSF codes are mutually orthogonal, thus making it possible to distinguish one remote terminal from another.

Before sending a signal over the transmission channel to a remote terminal, the signal has been scrambled and spread by the base section using the scrambling code of the base station and the OVSF code of the remote terminal. In CDMA systems, it is again possible to distinguish between those which use a distinct frequency for transmission and reception (CDMA-FDD system), and those which use a common frequency for transmission and reception but distinct time domains for transmission and reception (CDMA-TDD system).

Third-generation terminals, such as cellular mobile telephones, must be compatible with the UMTS standard, that is, they must be capable of operating under various wireless transmission standards. Thus, they will have to be capable of operating in a system of the FDMA/TDMA type, for example according to the GSM or GPRS transmission standard, or else in communication systems of the CDMA-FDD or CDMA-TDD type, for example by using the UTRA-FDD, UTRA-TDD or IS-95 transmission standards.

The invention thus applies in particular to all terminals or components of wireless communication systems, such as cellular mobile telephones for example, regardless of the transmission standard used. This is whether the latter provides for constant envelope modulation (GSM and DCS systems, for example) or variable envelope modulation (systems of the CDMA type), although the invention is especially advantageous with respect to variable envelope modulation systems.

The radio frequency transmission circuitry of a component of a wireless communication system, such as a cellular mobile telephone for example, comprises a power amplifier for amplifying the signal to a sufficient level for transmission. In systems operating according to the CDMA standard, which exhibits variable envelope modulation, use is made of linear transmission circuitry that makes it possible to resend the amplitude of the signal without distortion.

One approach for embodying the power amplification of the transmission circuitry includes using amplification circuitry of the delta-sigma type. An example of such an architecture is described, for example, in U.S. Pat. No. 5,777,512. Amplification circuitry of the delta-sigma type intrinsically exhibits the advantage of being more competitive in terms of efficiency than conventional linear amplification means. However, the use of amplification circuitry of the delta-sigma type exhibits drawbacks that will now be discussed.

Such amplification circuitry comprises frequency selector networks that make it possible to adjust the position of the zeros of the noise transfer function, that is, to adjust the frequencies at which the quantization noise is in theory eliminated. Also, traditionally, these zeros are placed in the useful or desired transmission band in which the signal is situated, so as to comply with the signal/noise ratio required by the transmission standard used.

It is necessary to comply with noise templates defined by the transmission standards, and outside the useful band of the signal, the noise must not exceed a certain level of energy so as not to disturb other transmissions/receptions using different transmission standards. Also, this noise results, in particular, from the quantization noise produced by the delta sigma amplifier and from the noise being added to the input signal of the amplifier.

Since the major portion of the quantization noise is pushed out of the useful band of the signal, it is then necessary to make provisions at the output for the amplification circuitry of delta-sigma type. That is, one or more post-amplifier filters are outside the useful signal band, and their function in particular, includes eliminating the quantization noise.

Moreover, there are filtering constraints on the elements of the transmission circuitry that are upstream of the delta sigma amplifier so as to limit the noise being added to the input signal of the amplifier. Furthermore, the dynamic constraint at the level of the transmission antenna is significant. This then results in a constraint on the signal level at the output of the power amplification circuitry (by way of indication, the maximum level required at the output of the amplifier in the WCDMA standard is 27 dBm), and consequently on the signal level at the input of the amplifier.

At present, with a typical gain of the amplifier being 25 dB, the maximum level of the signal at the input of the amplifier has to be 2 dBm in the WCDMA standard. This has a significant impact on power consumption. Thus, not only does the input dynamic swing of the power amplification circuitry have to be high, but the output power of the mixer upstream of the power amplification device also has to be considerable. This also is a penalty in terms of power consumption.

SUMMARY OF THE INVENTION

An object of the present invention is to decrease the input dynamic swing of the power amplification circuitry, and to reduce the output power of the mixer upstream of the power amplification device.

Another object of the present invention is to improve the filtering of the input signal outside of the useful band, and consequently, to relax the filtering constraints on the elements of the transmission circuitry that are upstream of the power amplification circuitry.

Yet another object of the present invention is to adjust the gain of the amplifier, in particular, in the useful transmission band without degrading the signal/noise ratio.

These and other objects, advantages and features in accordance with the present invention are provided by a power amplification device comprising an input for receiving a signal having a useful frequency band, and power amplification circuitry of the delta-sigma type.

According to a general characteristic of the invention, the power amplification circuitry of the delta-sigma type may exhibit a global order greater than or equal to one, and the power amplification device may comprise at least two signal amplifiers (signal gains) connected between the input and the power amplification circuitry. The relative values of the signal gains may be adjusted so as to locate the zeros of the signal transfer function outside the useful frequency band. The number of signal amplifiers (signal gains) may be equal to the global order, increased by one unit, of the power amplification circuitry.

Stated otherwise, the invention addresses the problem of decreasing the input dynamic swing and the filtering of the noise being added to the input signal outside of the useful frequency band of the signal by modifying the conventional architecture of the amplification circuitry of the delta-sigma type.

More precisely, the presence of at least two signal gains makes it possible to adjust the zeros of the polynomial transfer function of the signal. Since the zeros of the transfer function of the signal are then different from the zeros of the transfer function of the noise, it is also possible to adjust, through the presence of these signal gains, frequency values that are outside the useful band and for which one wishes to eliminate noise in the input signal. Thus, through the actual construction of the power amplification circuitry, a filtering of the input signal outside of the useful band is achieved, thereby making it possible to relax the filtering constraints on the elements upstream of the power amplification device.

Moreover, since the signal gain or gains act only on the input signal, the input dynamic swing of the amplification circuitry is thus reduced, and consequently, so is the output power of the mixer that is upstream.

Furthermore, the invention makes it possible to set the total gain of the power amplification circuitry by altering the value of the signal gains. It is also possible to make provisions for programmable signal gains. The power amplification device according to the invention may advantageously be embodied in the form of an integrated circuit.

Another aspect of the invention is directed to a component of a wireless communication system comprising a power amplification device as defined hereinabove. The component may be a cellular mobile telephone or a base station, for example.

BRIEF DESCRIPTION OF THE DRAWINGS

Other advantages and characteristics of the invention will become apparent on examining the detailed description of non-limiting embodiments and the appended drawings, in which.

DETAILED DESCRIPTION OF THE PREFERRED EMBODIMENTS

Figure 1:
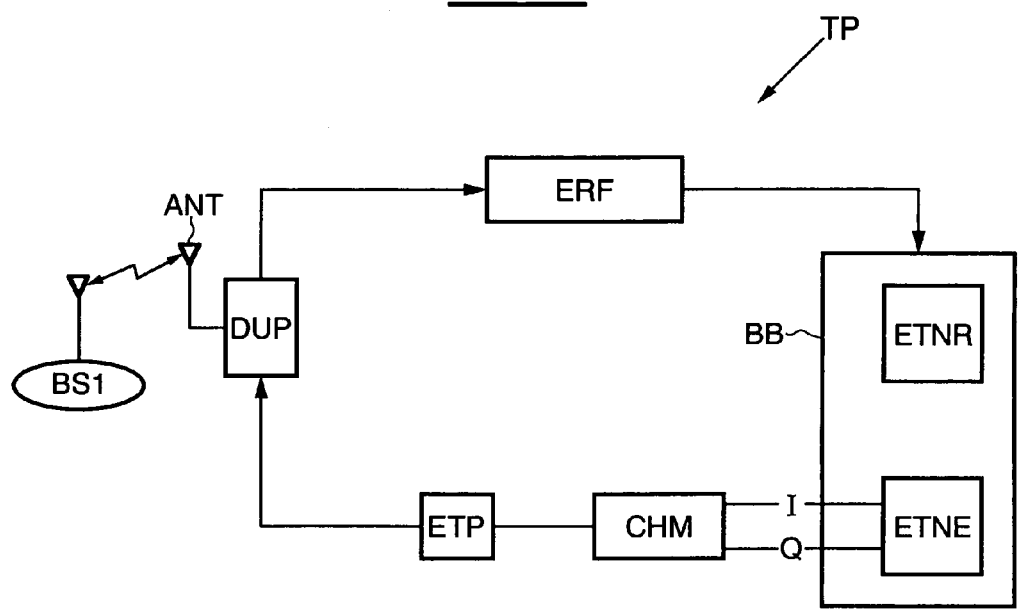
FIG. 1 illustrates diagrammatically the structure of a cellular mobile telephone according to the present invention.

In FIG. 1, the reference TP designates a remote terminal, such as a cellular mobile telephone, which is in communication with a base station BS1, for example, according to a communication scheme of the CDMA-FDD type (for example, the UTRA-FDD standard). The cellular mobile telephone TP comprises, in a conventional manner, a radio frequency analog stage ERF connected to an antenna ANT by way of a duplexer DUP, so as to receive an input signal.

Conventionally, the analog stage ERF comprises a low noise amplifier and two processing pathways including mixers, conventional filters and amplifiers. The two mixers respectively receive from a phase-lock loop two signals exhibiting a 90° mutual phase difference. After frequency transposition in the mixers, the two processing pathways respectively define two streams I (direct stream) and Q (quadrature stream) according to terminology well known to those skilled in the art.

After digital conversion in analog/digital converters ADC, the two streams I and Q are delivered to a reception processing stage ETNR. This processing stage ETNR comprises, in a conventional manner, a receiver commonly designated as a Rake receiver followed by demodulation circuitry for demodulating the spectrum delivered by the Rake receiver. The processing stage ETNR also comprises in a conventional manner a source decoder for performing a source decoding, as readily understood by those skilled in the art.

The baseband BB processing block comprises, in addition to the processing stage ETNR, a transmission processing stage ETNE which performs, in a conventional manner, the processing operations of source coding, spreading of the symbols, and modulation so as to deliver the two streams I and Q to transmission circuitry CHM. The transmission circuitry CHM includes at the front end, in particular, digital/analog converters, as well as mixers for performing a frequency transposition to the transmission frequency. The transposition signals are delivered by a phase-lock loop (not represented here for the sake of simplification) likewise controlled by automatic frequency-control circuitry incorporated into the transmission processing stage ETNE.

The transmission circuitry CHM is conventionally followed by a power amplifier stage ETP connected to the antenna by the duplexer DUP. Values of noise level not to be exceeded at the level of the antenna connector are defined in specification TS25 101 by the 3GPP standardization group.

The power amplification device according to the invention is configured in such a way as to satisfy the requirements of the signal/noise ratio in the useful band of the signal, and to introduce a filtering of the noise being added to the input signal while exhibiting a reduced input dynamic swing.

Figure 2:
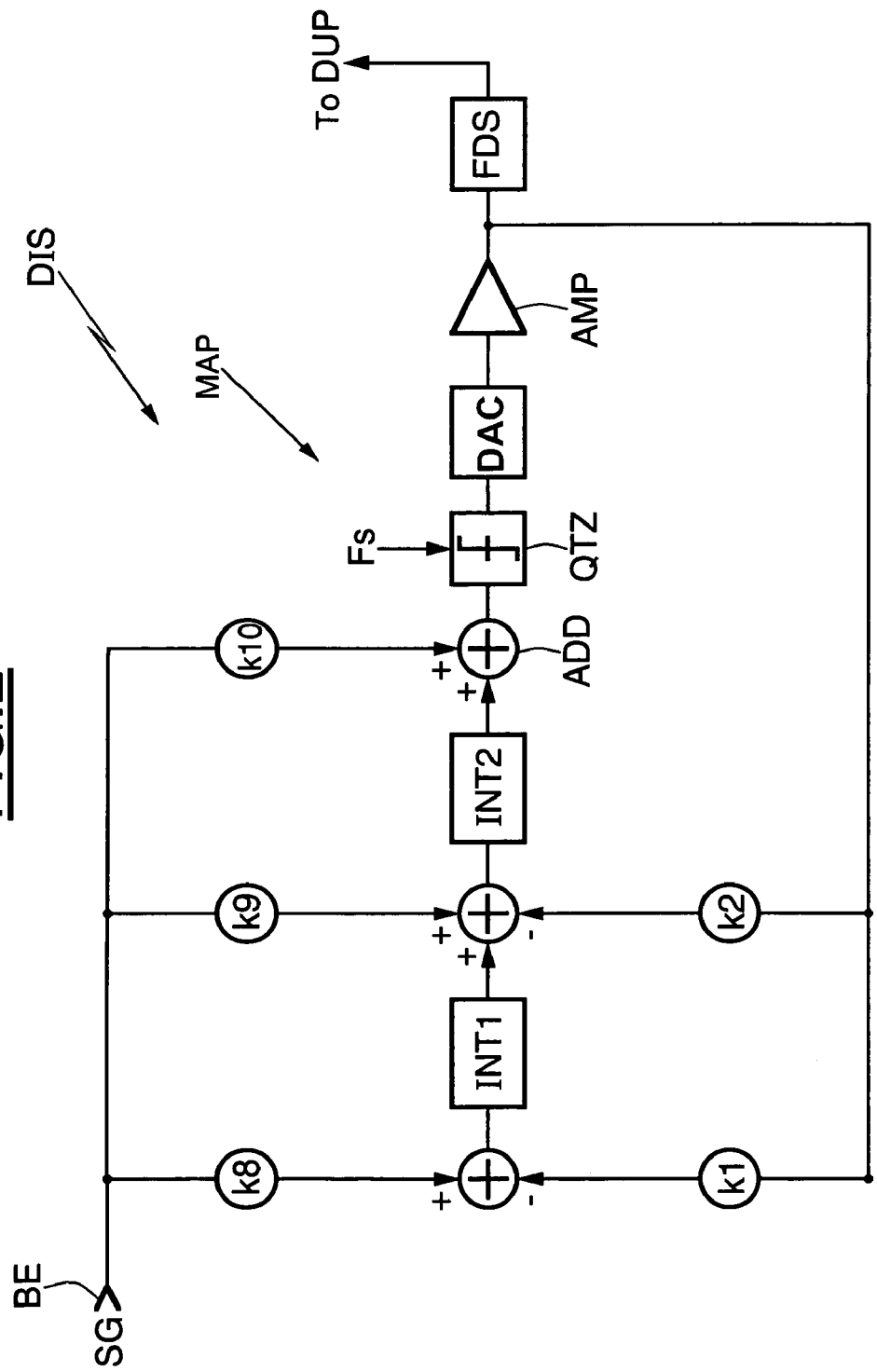
FIG. 2 illustrates diagrammatically an embodiment of a power amplification device according to the present invention.

More precisely, as illustrated in FIG. 2, the power amplification device DIS comprises an input terminal BE that receives the signal SG to be amplified, and is followed by power amplification means or circuitry MAP of the delta-sigma type. The signal SG originates from a mixer that has transposed the signal into the radio frequency domain.

In a general manner, there are provided at least two signal gains (signal amplifiers) disposed between the input terminal BE and the power amplification circuitry MAP. In this instance, provision is made for 3 signal gains k8–k10, connected respectively between the input terminal BE and adders/subtractors disposed upstream of integration circuitry, here formed of frequency selector networks INT1–INT2, as well as between the input terminal BE and an additional adder ADD disposed between the frequency selector network INT2 and quantization circuitry QTZ.

The signal delivered at the output of the adder ADD is then quantized on one bit in quantization circuitry QTZ. The signal, which is a square waveform and is delivered by the quantization circuitry QTZ, is then amplified in a class E power amplifier AMP after digital-to-analog conversion DAC.

The output of the amplifier is looped back to the inputs of the adders/subtractors by two continuous gains referenced k1 and k2 respectively in this example. The output of the amplifier AMP is also linked to the input of a post-amplifier filter FDS, which is a bandpass filter, whose output is linked to the duplexer DUP.

The power amplification circuitry MAP of the delta-sigma type, have here, for reasons of simplifying FIG. 2, a global order equal to 2 (since the number of integrators is equal to 2). The two frequency selector networks INT1 and INT2 are inductive capacitive networks tuned respectively to frequencies in the useful signal band, that is, between 1920 and 1980 MHz in the present case.

More precisely, the network INT1 can be tuned, for example, to the frequency of 1940 MHz while the network INT2 can be tuned to the frequency of 1960 MHz. In a general manner, the resonant frequencies of the various frequency selector networks set the zeros of the transfer function of the noise, that is, the frequencies at which the quantization noise is eliminated.

The two zeros of the noise transfer function, corresponding to the two resonant frequencies of the networks INT1 and INT2 have the goal of satisfying the requirements of the signal/noise ratio in the signal's useful transmission band. The poles of the transfer function are set by the continuous feedback gains k1 and k2 and are placed in such a way as to stabilize the entire system.

Moreover, the embodiment of FIG. 2 affords a further degree of freedom for setting the zeros of the transfer function of the signal. Specifically, as indicated above, the zeros and the poles of the transfer function of the noise are set by the frequencies of the frequency selector networks as well as by the feedback gains k1 and k2. Moreover, the poles of the transfer function of the signal are identical to the poles of the transfer function of the noise.

If provision is not made for at least two signal gains disposed between the input terminal BE and the input of the quantization circuitry QTZ (directly or indirectly by way of the frequency selector networks) then the zeros of the transfer function of the signal would automatically be set, once the feedback gains and the tuning frequencies of the frequency selector networks have been set.

However, in the presence of at least two signal gains, it is then possible to adjust the location of the zeros of the signal transfer function by altering the relative values of the signal gains k8 to k10. This makes it possible to introduce a filtering of the input signal SG outside of the useful band.

Specifically, locating the zeros of the signal transfer function outside the useful band (based on the relative values of the signal gains) makes it possible to ensure filtering of the input signal SG and to eliminate some nuisance noise at predetermined frequencies situated outside of the useful band. It is thus possible to relax the filtering constraint on the elements of the transmission circuitry that are upstream of the power amplification device.

Moreover, by altering the absolute value of the signal gains it is possible to adjust the gain of the amplifier, in particular, in the useful transmission band, and to do so without degrading the signal/noise ratio. Moreover, since these signal gains act only on the input signal, the input dynamic swing of the power amplification circuitry is thus reduced. These signal gains may also possibly be programmable.

The presence of such signal gains makes it possible to reduce the output power of the mixer disposed upstream of the power amplification device. Thus, 15 dB of gain in the signal allows a decrease of 15 dB in the maximum power necessary at the output of the mixer.

Finally, the linearity requirements of the system are most constraining on the input stages of the power amplification circuitry. Also, the more one moves towards the quantization circuitry, the more the constraints on the linearity performance of the intermediate blocks are relaxed, that is, on blocks corresponding to the gains k9 and k10.

That which is claimed is:

1. A power amplification device comprising:
    an input for receiving a signal having a desired frequency band, the signal also having a transfer function associated therewith;
    power amplification means of the delta-sigma type having an order greater than or equal to one; and
    a plurality of signal amplifiers connected between the input and said power amplification means, each signal amplifier having a predetermined gain so that zeros of the transfer function are outside the desired frequency band.

2. A power amplification device according to claim 1, wherein a number of said plurality of signal amplifiers is equal to the order of said power amplification means plus one.

3. A power amplification device according to claim 1, wherein each signal amplifier is programmable for setting its predetermined gain.

4. A power amplification device according to claim 1, wherein said power amplification means comprises at least one frequency selector network tuned to a frequency within the desired frequency band.

5. A power amplification device according to claim 1, wherein said power amplification means and said plurality of signal amplifiers are configured so that the power amplification device is an integrated circuit.

6. A power amplification device comprising:
    an input for receiving a signal having a desired frequency band, the signal also having a transfer function associated therewith;
    power amplification circuitry having an order greater than or equal to one; and
    a plurality of signal amplifiers connected between the input and said power amplification circuitry, each signal amplifier having a predetermined gain so that zeros of the transfer function are outside the desired frequency band.

7. A power amplification device according to claim 6, wherein a number of said plurality of signal amplifiers is equal to the order of said power amplification circuitry plus one.

8. A power amplification device according to claim 6, wherein each signal amplifier is programmable for setting its predetermined gain.

9. A power amplification device according to claim 6, wherein said power amplification circuitry comprises at least one frequency selector network tuned to a frequency within the desired frequency band.

10. A cellular telephone comprising
    transmission circuitry for receiving a signal having a desired frequency band to be transmitted, the signal also having a transfer function associated therewith; and
    a power amplification device connected to said transmission circuitry and comprising
        power amplification circuitry having an order greater than or equal to one, and
        a plurality of signal amplifiers connected to said power amplification circuitry and receiving the signal to be transmitted, each signal amplifier having a predetermined gain so that zeros of the transfer function are outside the desired frequency band.

11. A cellular telephone according to claim 10, wherein a number of said plurality of signal amplifiers is equal to the order of said power amplification circuitry plus one.

12. A cellular telephone according to claim 10, wherein each signal amplifier is programmable for setting its predetermined gain.

13. A cellular telephone according to claim 10, wherein said power amplification circuitry comprises at least one frequency selector network tuned to a frequency within the desired frequency band.

14. A method for forming a power amplification device, the method comprising:
    providing an input for receiving a signal having a desired frequency band, the signal also having a transfer function associated therewith;
    providing power amplification circuitry of the delta-sigma type having an order greater than or equal to one; and
    connecting a plurality of signal amplifiers between the input and the power amplification circuitry, each signal amplifier having a predetermined gain so that zeros of the transfer function are outside the desired frequency band.

15. A method according to claim 14, wherein a number of the plurality of signal amplifiers is equal to the order of the power amplification circuitry plus one.

16. A method according to claim 14, wherein each signal amplifier is programmable for setting its predetermined gain.

17. A method according to claim 14, wherein the power amplification circuitry comprises at least one frequency selector network tuned to a frequency within the desired frequency band.

* * * * *